(12) United States Patent
Itakura et al.

(10) Patent No.: US 12,095,469 B2
(45) Date of Patent: Sep. 17, 2024

(54) RESONANCE FREQUENCY DETECTOR AND SENSING DEVICE

(71) Applicant: KABUSHIKI KAISHA TOSHIBA, Tokyo (JP)

(72) Inventors: Tetsuro Itakura, Nerima Tokyo (JP); Ryunosuke Gando, Yokohama Kanagawa (JP); Daiki Ono, Yokohama Kanagawa (JP); Kei Masunishi, Kawasaki Kanagawa (JP); Akihide Sai, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 85 days.

(21) Appl. No.: 17/940,796

(22) Filed: Sep. 8, 2022

(65) Prior Publication Data

US 2023/0253972 A1 Aug. 10, 2023

(30) Foreign Application Priority Data

Feb. 7, 2022 (JP) ................. 2022-017357

(51) Int. Cl.
*H03L 7/091* (2006.01)
*H03L 7/099* (2006.01)

(52) U.S. Cl.
CPC ............ *H03L 7/091* (2013.01); *H03L 7/0992* (2013.01)

(58) Field of Classification Search
CPC ......... H03L 7/00; H03L 7/081; H03L 7/0814; H03L 7/087; H03L 7/091; H03L 7/099; H03L 7/0991; H03L 7/0992; H03L 7/101; H03L 7/102; H03L 7/103; H03L 7/107; H04L 27/2272

USPC .................. 375/327, 375, 376; 327/147, 156
See application file for complete search history.

(56) References Cited

U.S. PATENT DOCUMENTS

| | | | |
|---|---|---|---|
| 4,951,508 A | 8/1990 | Loper, Jr. et al. | |
| 5,645,210 A * | 7/1997 | Toner | B23K 20/10 228/8 |
| 11,201,588 B2 | 12/2021 | Haneda et al. | |
| 2003/0137216 A1* | 7/2003 | Tamayo de Miguel | G01Q 20/04 310/311 |
| 2020/0145013 A1* | 5/2020 | Ng | H03L 7/089 |
| 2023/0125664 A1 | 4/2023 | Itakura et al. | |

FOREIGN PATENT DOCUMENTS

| | | | |
|---|---|---|---|
| CN | 102931980 A | * | 2/2013 |
| JP | 2021-97354 A | | 6/2021 |
| JP | 2023-62480 A | | 5/2023 |

* cited by examiner

*Primary Examiner* — Young T. Tse (74) *Attorney, Agent, or Firm* — Finnegan, Henderson, Farabow, Garrett & Dunner, LLP (57) ABSTRACT

A resonance frequency detector has an adder that adds a correction term to an oscillation frequency of an output signal of an oscillator, and detects a predetermined resonance frequency of a resonance element. The correction term is generated based on a phase error in a phase locked loop and a degree of change in phase at the resonance frequency, and the phase locked loop generates a control signal based on the phase error between an output signal of the resonance element that resonates at the resonance frequency and the output signal of the oscillator that varies the oscillation frequency according to the control signal.

17 Claims, 10 Drawing Sheets

RESONANCE FREQUENCY DETECTOR AND SENSING DEVICE

CROSS REFERENCE TO RELATED APPLICATIONS

This application is based upon and claims the benefit of priority from the prior Japanese Patent Application No. 2022-017357, filed on Feb. 7, 2022, the entire contents of which are incorporated herein by reference.

FIELD

An embodiment of the present invention relates to a resonance frequency detector and a sensing device.

BACKGROUND

The resonance frequency of a resonance element changes depending on environmental conditions such as a temperature. A phase locked loop is known which performs feedback control such that the oscillation frequency of a variable-frequency oscillator does not change even when the resonance frequency changes.

However, it is practically difficult to cause the oscillation frequency to accurately follow the temporal change of the resonance frequency, and a frequency error between the oscillation frequency and the resonance frequency occurs. For this reason, even when the resonance frequency is detected by the phase locked loop, and a physical quantity such as an acceleration is detected using the detected resonance frequency, the detected resonance frequency itself includes an error, so that the detection accuracy of the physical quantity is decreased.

DETAILED DESCRIPTION

According to one embodiment, a resonance frequency detector has:

an adder that adds a correction term to an oscillation frequency of an output signal of an oscillator, and detects a predetermined resonance frequency of a resonance element, wherein the correction term is generated based on a phase error in a phase locked loop and a degree of change in phase at the resonance frequency, and the phase locked loop generates a control signal based on the phase error between an output signal of the resonance element that resonates at the resonance frequency and the output signal of the oscillator that varies the oscillation frequency according to the control signal.

Hereinafter, embodiments of a resonance frequency detector and a sensing device will be described with reference to the drawings. Although main components of the resonance frequency detector and the sensing device will be mainly described below, the resonance frequency detector and the sensing device may have components and functions that are not illustrated or described. The following description does not exclude components and functions that are not illustrated or described.

First Embodiment

Figure 1:
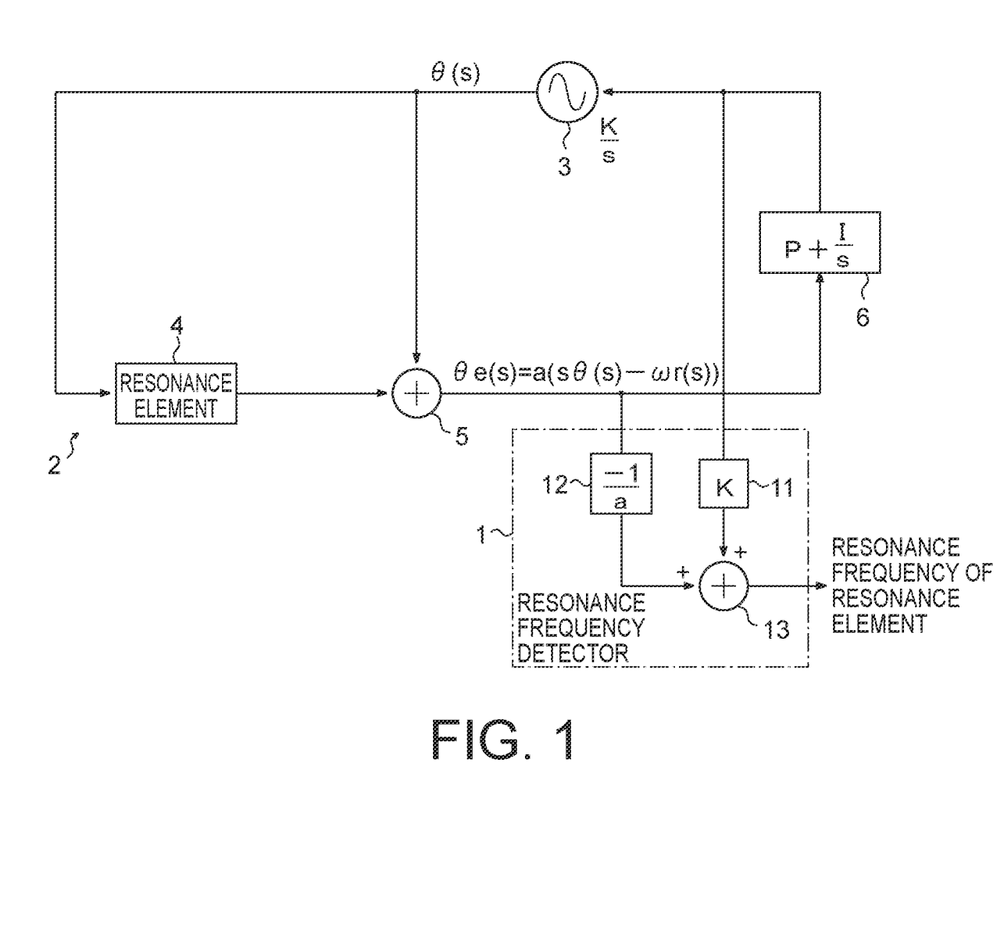
FIG. 1 is a block diagram illustrating a schematic configuration of a resonance frequency detector and a phase locked loop according to a first embodiment.
Figure 2:
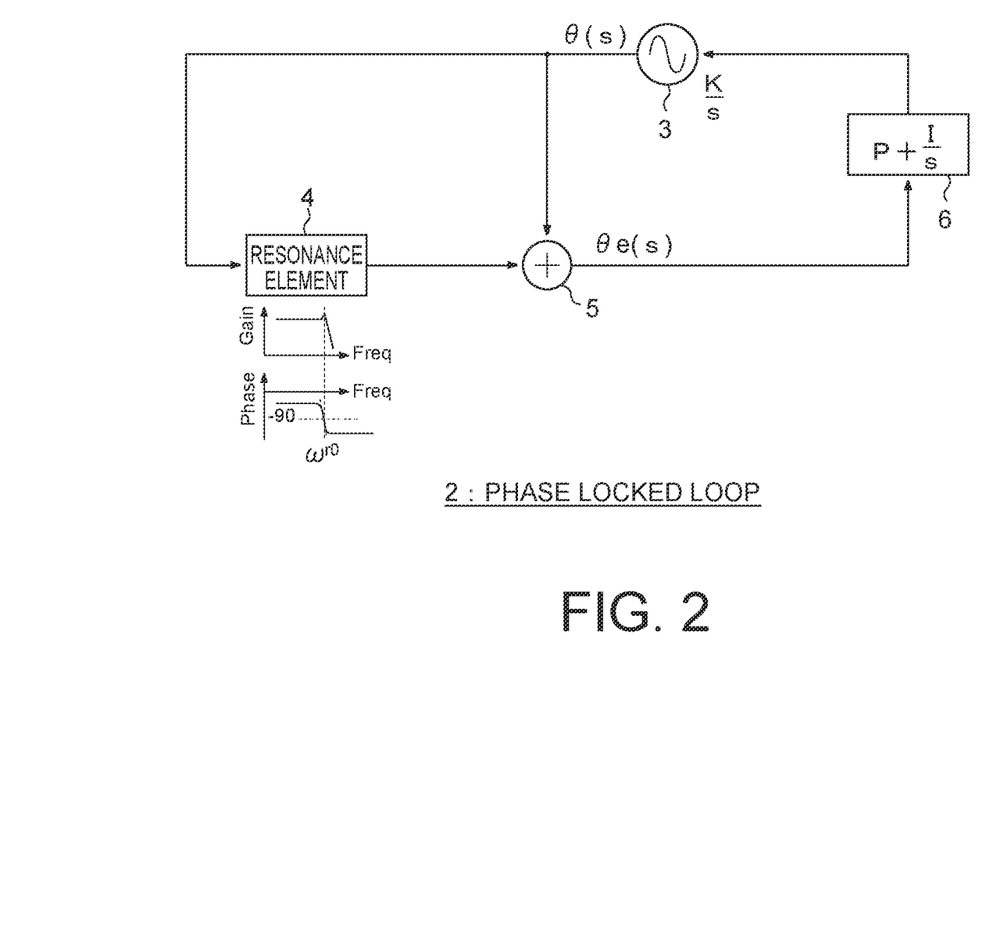
FIG. 2 is a block diagram illustrating a schematic configuration of a phase locked loop according to a comparative example.

FIG. 1 is a block diagram illustrating a schematic configuration of a resonance frequency detector 1 and a phase locked loop 2 according to a first embodiment, and FIG. 2 is a block diagram illustrating a schematic configuration of a phase locked loop 2 according to a comparative example. Before the configuration of the resonance frequency detector 1 of FIG. 1 is described, the configuration of the phase locked loop 2 of FIG. 2 will be described.

The phase locked loop 2 of FIG. 2 includes a variable-frequency oscillator 3, a resonance element 4, a phase detector 5, and a feedback control unit 6. The phase locked loop 2 generates the above-described control signal on the basis of a phase error between the output signal of the resonance dement 4 resonating at a predetermined resonance frequency and the output signal of the variable-frequency oscillator 3 that varies the frequency according to the control signal.

The variable-frequency oscillator 3 generates an oscillation signal having a variable frequency. More specifically, the variable-frequency oscillator 3 controls the frequency of the oscillation signal on the basis of the control signal output from the feedback control unit 6. The variable-frequency oscillator 3 generates an oscillation signal having a frequency obtained by multiplying the control signal by a frequency conversion coefficient K.

In FIG. 2, a phase signal obtained by Laplace transforming the phase of the output signal (oscillation signal) of the variable-frequency oscillator 3 is denoted as $\theta(s)$. The output signal of the variable-frequency oscillator 3 is input to the resonance element 4. The resonance element 4 has a steep Q at the resonance frequency, and the phase is delayed by 90 degrees at the resonance frequency. More specifically, the resonance element 4 resonates at a predetermined resonance frequency, and outputs a signal in which the phase of the output signal of the variable-frequency oscillator 3 is shifted by 90 degrees at the resonance frequency.

When the oscillation frequency of the output signal of the variable-frequency oscillator 3 deviates from the resonance frequency of the resonance element 4, the phase delay in the resonance element 4 deviates from 90 degrees. Assuming that a phase error signal obtained by Laplace transforming a phase error which is the deviation component is defined as $\theta e(s)$ and that a signal obtained by Laplace transforming the phase of the output signal of the variable-frequency oscillator 3 is defined as θ(s), a phase signal obtained by Laplace transforming the phase of the output signal of the resonance element 4 becomes θ(s) 90°/s θe(s).

The phase detector 5 detects a phase error between the phase of the output signal of the variable-frequency oscillator 3 and the phase of the output signal of the resonance element 4. When a difference is obtained between the phase signal θ(s) obtained by Laplace transforming the phase of the output signal of the variable-frequency oscillator 3 and the phase signal θ(s)−90°/s−θe(s) obtained by Laplace transforming the phase of the output signal of the resonance element 4, the phase error becomes 90°/s−θe(s). When an oscillation signal having a phase shifted by 90 degrees is generated in advance from the variable-frequency oscillator 3 and input to the phase detector 5, the phase error detected by the phase detector 5 becomes θe(s).

The feedback control unit 6 generates a control signal by performing proportional control (also referred to as P control) and integral control (also referred to as I control) according to the phase error detected by the phase detector 5. The feedback control unit 6 can be configured by a filter having a proportional term P and an integral term I.

The variable-frequency oscillator 3 generates an oscillation signal having a frequency obtained by multiplying the control signal output from the feedback control unit 6 by the frequency conversion coefficient K. The frequency conversion coefficient K is a coefficient unique to the variable-frequency oscillator 3. In FIG. 2 or the like, since the output signal of the variable-frequency oscillator 3 is expressed by a phase, the variable-frequency oscillator 3 is expressed as K/s in order to integrate the frequency into the phase.

In a case where the oscillation frequency of the variable-frequency oscillator 3 is close to the resonance frequency of the resonance element 4, the phase characteristic in the vicinity of the resonance frequency of the resonance element 4 can be linearly approximated, and when an inclination representing the degree of change in phase at the resonance frequency of the resonance element 4 is a, as shown in Expression (1), the phase error θe(s) can be expressed by a value obtained by multiplying a difference between the oscillation frequency of the variable-frequency oscillator 3 and the resonance frequency of the resonance element 4 by the coefficient a.

$$\theta e(s) = a(s\theta(s) - \omega r(s)) \quad (1)$$

Here, since the output frequency of the variable-frequency oscillator 3 may be obtained by differentiating the phase θ(s), the output frequency can be expressed as sθ(s) by multiplying s in Laplace notation. ω_r(s) is obtained by Laplace transforming the resonance frequency ω_r(t) of the resonance element 4 which changes with time according to the temporal change of environment. Therefore, when a frequency error between the oscillation frequency of the variable-frequency oscillator 3 and the resonance frequency of the resonance element 4 is Laplace transformed, the frequency error is expressed by sθ(s)−ω_r(s). From FIG. 2, the output signal θ(s) of the variable-frequency oscillator 3 is expressed by following Expression (2).

$$\theta(s) = \theta_e(s)\left(P + \frac{I}{s}\right)\frac{K}{s} = \frac{\theta_e(s)(sP + I)K}{s^2} \quad (2)$$

From Expressions (1) and (2), the output signal θ(s) of the variable-frequency oscillator 3 is expressed by following Expression (3).

$$\theta(s) = \frac{-a\omega_r(s)(sP + I)K}{s\{s(1 - aKP) - aKI\}} \quad (3)$$

From Expression (3), the frequency error sθ(s)−ω_r(s) between the oscillation frequency of the variable-frequency oscillator 3 and the resonance frequency of the resonance element 4 is expressed by following Expression (4).

$$s\theta(s) - \omega_r(s) = \frac{-s\omega_r(s)}{s(1 - aKP) - aKI} \quad (4)$$

As described above, it can be seen that when the resonance frequency of the resonance element 4 changes with time, the oscillation frequency of the variable-frequency oscillator 3 cannot follow the change in the resonance frequency, and a frequency error occurs.

In this regard, the resonance frequency detector 1 of FIG. 1 is characterized in that an accurate resonance frequency is obtained by setting the frequency error expressed by Expression (4) to zero. The resonance frequency detector 1 of FIG. 1 is connected to the phase locked loop 2 having the same configuration as the phase locked loop 2 of FIG. 2, and includes an oscillation frequency detector 11, a correction term generation unit 12, and an adder 13. Note that the combined configuration of the phase locked loop 2 and the resonance frequency detector 1 in FIG. 1 can be used in a sensing device or a physical quantity detection device as described later.

The oscillation frequency detector 11 detects the oscillation frequency of the output signal of the variable-frequency oscillator 3 by multiplying the control signal output from the feedback control unit 6 by the frequency conversion coefficient K. The correction term generation unit 12 generates a correction term by multiplying the reciprocal of the inclination of the phase at the resonance frequency of the resonance element 4 by a phase error. The adder 13 detects the resonance frequency by adding the oscillation frequency detected by the oscillation frequency detector 11 by the correction term generated by the correction term generation unit 12.

Since the output signal of the variable-frequency oscillator 3 is expressed by θ(s), the input signal of the variable-frequency oscillator 3 is expressed as sθ(s)/K by dividing θ(s) by K/s. Therefore, the oscillation frequency detector 11 in FIG. 1 calculates sθ(s) which is the oscillation frequency of the variable-frequency oscillator 3 by multiplying the input signal of the variable-frequency oscillator 3 by K. Although not illustrated, the oscillation frequency may be calculated from the number of counts within a predetermined period by counting the output signals of the variable-frequency oscillator 3.

The correction term generation unit 12 divides the output of the phase detector 5 by an inclination a of the phase at the resonance frequency of the resonance element 4 and multiplies the result by a negative value (for example, −1) to generate a correction term. Since the output of the phase detector 5 is also an input of the feedback control unit 6, the correction term can be generated by dividing $s^2\theta(s)/\{(sP+I)K\}$, which is obtained by dividing sθ(s)/K which is the output of the feedback control unit 6, that is, the input of the variable-frequency oscillator 3 by P+I/s, by a coefficient a and multiplying the result by −1. The generated correction term is $-s^2\theta(s)/\{a(sP+I)K\}$.

This correction term is added by the adder 13 to the oscillation frequency sθ(s) detected by the oscillation frequency detector 11. When the calculation is performed using Expression (3), the frequency error is canceled, and the accurate resonance frequency is obtained as follows, $$s\theta(s) + \frac{s^2\theta(s)}{-a(sP+I)K} = \frac{-a\omega_r(s)(sP+I)K}{s(1-aKP)-aKI} + \frac{s\omega_r(s)}{s(1-aKP)-aKI} = \frac{\omega_r(s)\{s-saPK-aIK\}}{s(1-aKP)-aKI} = \omega_r(s) \quad (5)$$

When the secondary resonance characteristic of the resonance element 4 is expressed by following Expression (6), the inclination a representing the degree of change in phase at the resonance frequency of the resonance element 4 can be obtained by differentiating the phase. Here, Q is a Q value of resonance, and ωo is a resonance frequency of the resonance element 4.

$$\frac{\omega_o^2}{s^2 + \frac{\omega_o}{Q}s + \omega_o^2} \quad (6)$$

Following Expression (7) expressing the phase is expressed by Expression (8) since s=jω.

$$\tan^{-1}\frac{I_m}{R_s} \quad (7)$$

$$\theta(\omega) = \tan^{-1}\frac{-\omega_o\omega}{Q(\omega_o^2 - \omega^2)} \quad (8)$$

Since Expression (9) is established, Expression (8) becomes Expression (10).

$$\frac{d}{dx}\tan^{-1}x = \frac{1}{1+x^2} \quad (9)$$

$$\frac{d}{d\omega}\tan^{-1}\frac{-\omega_o\omega}{Q(\omega_o^2-\omega^2)} = \frac{-Q\omega_o(\omega_o^2+\omega^2)}{\omega_o^2\omega^2+Q^2(\omega_o^2-\omega^2)^2} = \frac{-\frac{Q}{\omega_o}\left(1+\frac{\omega^2}{\omega_o^2}\right)}{\frac{\omega^2}{\omega_o^2}+Q^1\left(1-\frac{\omega^2}{\omega_o^2}\right)} \quad (10)$$

In Expression (10), when to =following Expression (11) is obtained.

$$\frac{d}{d\omega}\tan^{-1}\frac{-\omega_o\omega}{Q(\omega_o^2-\omega^2)}\bigg|_{\omega=\omega_o} = \frac{-\frac{2Q}{\omega_o}}{1} = -2\frac{Q}{\omega_o} \quad (11)$$

As can be seen from Expression (11), the inclination a of the phase at the resonance frequency is obtained as a=−2Q/ωo. Therefore, the inclination of the phase due to the resonance frequency may be calculated from a value obtained by dividing the Q value of the resonance by the resonance frequency.

Figure 3:
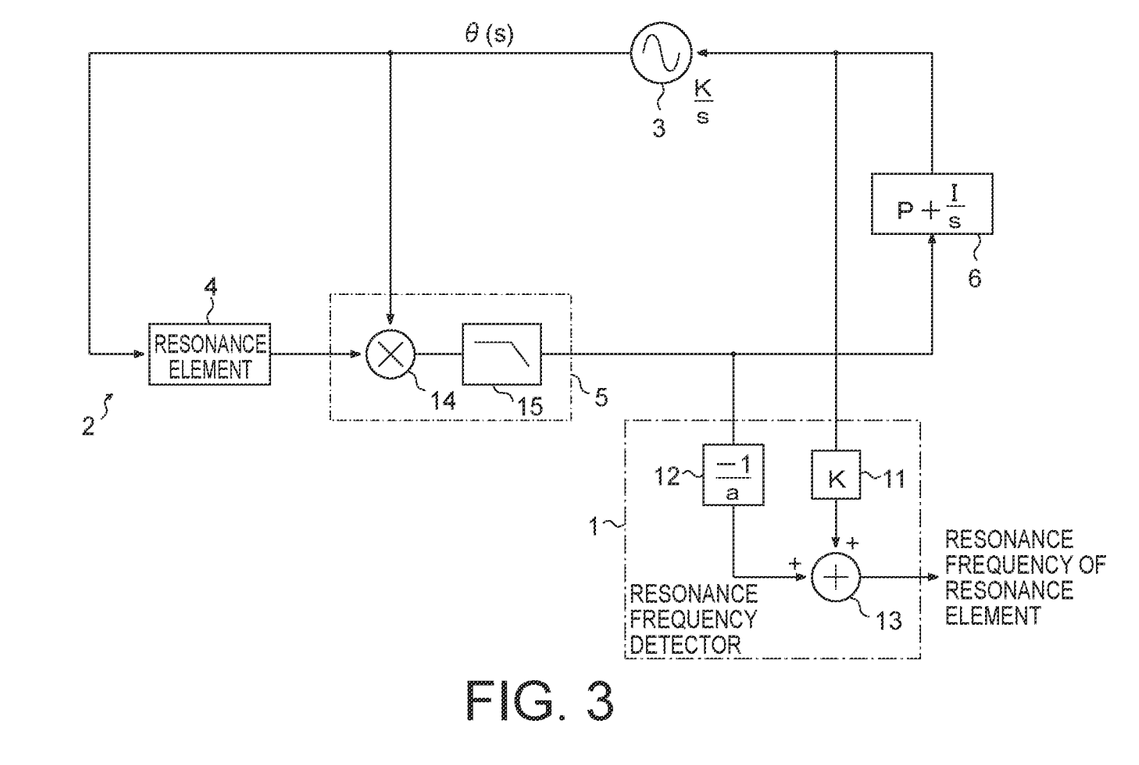
FIG. 3 is a block diagram of a phase locked loop and a resonance frequency detector according to a first modification of FIG. 1.

FIG. 3 is a block diagram of the phase locked loop 2 and the resonance frequency detector 1 according to a first modification of FIG. 1. The phase detector 5 of FIG. 3 includes a multiplier 14 and a low-pass filter 15.

In a case where the output signal of the variable-frequency oscillator 3 is cos θ(t), the output signal of the resonance element 4 is expressed by following Expression (12).

$$\cos\left(\theta(t) - \frac{\pi}{2} + \theta_e(t)\right) = \sin(\theta(t) + \theta_s(t)) \quad (12)$$

When the output signal of the variable-frequency oscillator 3 and the output signal of the resonance element 4 are multiplied by the multiplier 14, the signal expressed by following Expression (13) is generated.

$$\sin(\theta(t)+\theta_e(t))\cos\theta(t) = \frac{1}{2}\{\sin(2\theta(t)+\theta_s(t))+\sin\theta_e(t)\} \quad (13)$$

When the output signal of the multiplier 14 is input to the low-pass filter 15, a phase error θe(t) expressed by following Expression (14) is obtained.

$$\frac{1}{2}\sin\theta_e(t) \approx \theta_s(t)/2 \quad (14)$$

The variable-frequency oscillator 3 can supply two oscillation signals having phases different from each other by 90 degrees to the phase detector 5 separately from the oscillation signal supplied to the resonance element 4, and can generate an I signal and a Q signal by multiplying each of the two oscillation signals and the output signal of the resonance element 4.

Figure 4:
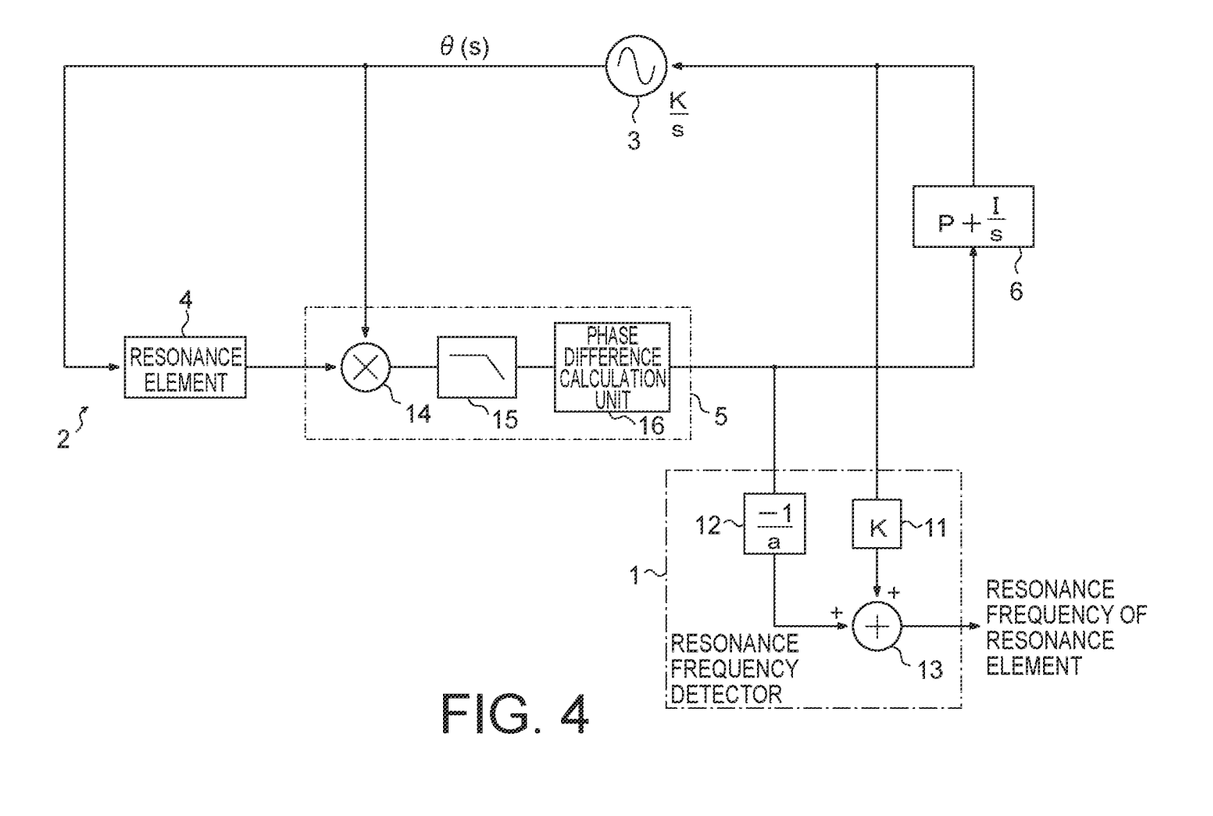
FIG. 4 is a block diagram of a phase locked loop and a resonance frequency detector according to a second modification of FIG. 1.

FIG. 4 is a block diagram of the phase locked loop 2 and the resonance frequency detector 1 according to a second modification of FIG. 1. The phase detector 5 in the phase locked loop 2 of FIG. 4 includes the multiplier 14, the low-pass filter 15, and a phase difference calculation unit 16.

The variable-frequency oscillator 3 of FIG. 4 supplies cos θ(t) among a plurality of oscillation signals having phases different by 90 degrees to the resonance element 4. An output signal x of the resonance element 4 is expressed by following Expression (15).

$$x = \cos\left(\theta(t) - \frac{\pi}{2} + \theta_s(t)\right) = \sin(\theta(t) + \theta_e(t)) \quad (15)$$

The multiplier 14 in the phase detector 5 multiplies the signal x of Expression (15) by each of two oscillation signals (2 sin θ(t), −2 cos θ(t)) having phases different from each other by 90 degrees to generate the I signal and the Q signal shown in following Expression (16).

$$I = x(2\sin\theta(t)), Q = x(-2\cos\theta(t)) \quad (16)$$

The low-pass filter 15 in the phase detector 5 extracts low-pass components $I_L$ and $Q_L$ included in the output signal of the multiplier 14 as expressed in Expression (17).

$$I_L = \cos\theta_e(t), Q_L = \sin\theta_e(t) \quad (17)$$

As shown in Expression (18), the phase difference calculation unit 16 calculates a phase error $\theta_e$ by an angle between $I_L$ and $Q_L$ in an IQ plane.

$$\theta_e = \tan^{-1}\frac{Q_L}{S_L} = \tan^{-1}\frac{\sin\theta_e(t)}{\cos\theta_e(t)} \quad (18)$$

Figure 5:
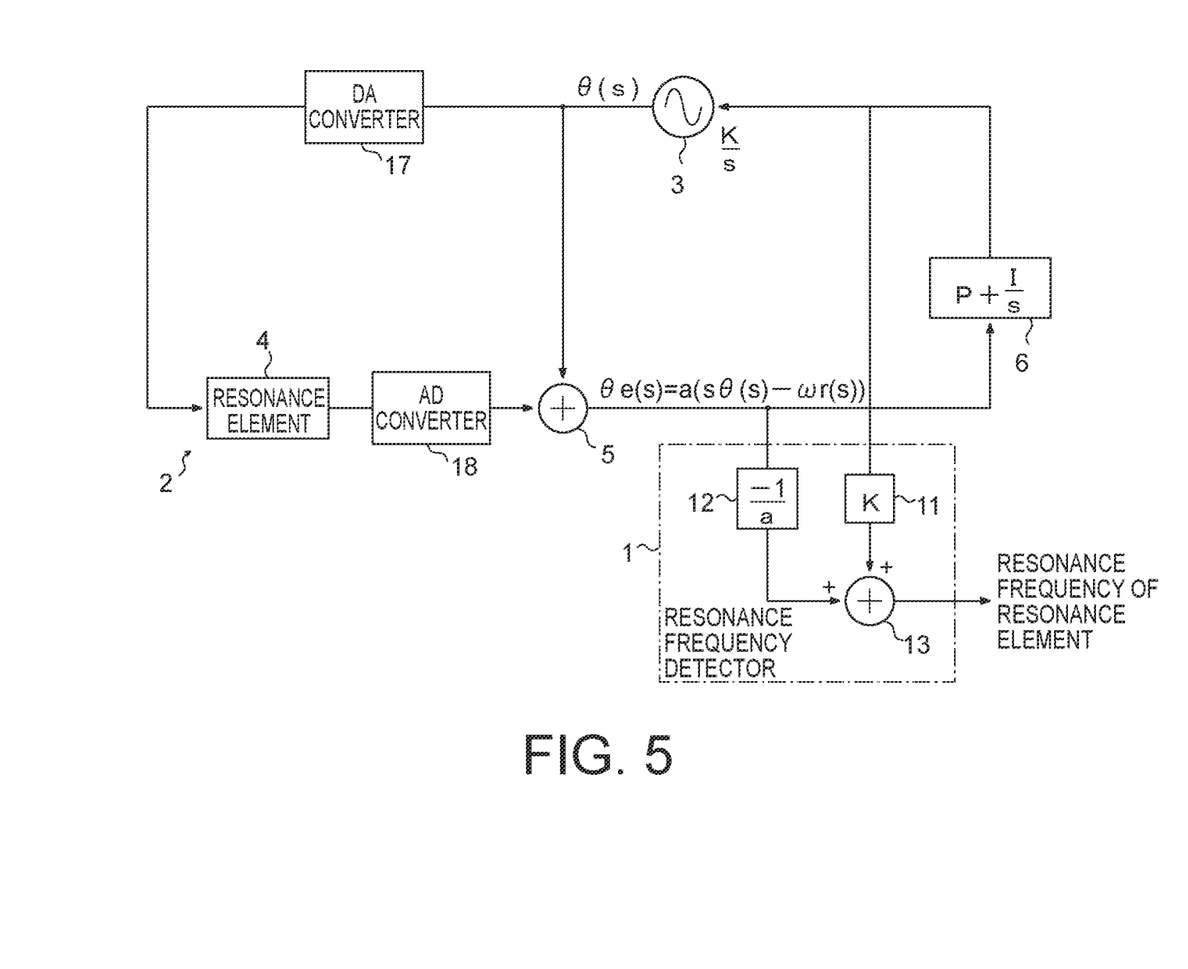
FIG. 5 is a block diagram of a phase locked loop and a resonance frequency detector according to a third modification of FIG. 1.

The phase locked loop 2 according to FIGS. 1 to 4 described above performs feedback control by an analog signal. An analog signal is easily affected by environment such as a temperature. In this regard, feedback control by a digital signal may be performed. FIG. 5 is a block diagram of the phase locked loop 2 and the resonance frequency detector 1 according to a third modification of FIG. 1.

The variable-frequency oscillator 3, the phase detector 5, the feedback control unit 6, and the resonance frequency detector 1 in FIG. 5 are all configured by a digital circuit. Only the resonance element 4 in FIG. 5 is an analog circuit. The output signal of the variable-frequency oscillator 3, the output signal of the feedback control unit 6, the output signal of the phase detector 5, the output signal of the oscillation frequency detector 11, the output signal of the correction term generation unit 12, and the output of the adder 13 are all digital signals.

The phase locked loop 2 of FIG. 5 includes a DA converter 17 and an AD converter 18 in addition to the configuration of FIG. 1. Hereinafter, the output signal of the variable-frequency oscillator 3 is referred to as a digital oscillation signal.

The DA converter 17 converts the digital oscillation signal output from the variable-frequency oscillator 3 into an analog oscillation signal. Similarly to FIG. 1, the resonance element 4 performs an analog resonance operation and outputs an analog signal. The AD converter 18 converts the output signal of the resonance element 4 into a digital signal. Hereinafter, the output of the AD converter 18 is referred to as a digital resonance signal.

The phase detector 5 detects a phase error between the digital oscillation signal output from the variable-frequency oscillator 3 and the digital resonance signal output from the AD converter 18, and outputs a digital signal indicating the phase error.

The feedback control unit 6 performs proportional control and integral control according to the digital signal output from the phase detector 5 to generate a control signal including a digital signal.

The oscillation frequency detector 11 multiplies the output signal (control signal) of the feedback control unit 6 including the digital signal by the frequency conversion coefficient K including a digital signal to generate the oscillation frequency of the variable-frequency oscillator 3 including a digital signal. In addition, the correction term generation unit 12 divides the digital signal output from the phase detector 5 by the inclination a of the phase including the digital signal at the resonance frequency of the resonance element 4 and multiplies the result by −1 to generate the correction term of the digital signal. The oscillation frequency of the digital signal and the correction term of the digital signal are added by the adder 13 to obtain a resonance frequency of a digital signal.

In the resonance frequency detector 1 of FIG. 5, since the variable-frequency oscillator 3 is configured by a digital circuit, the frequency conversion coefficient K does not vary due to the environment information such as a temperature and a power supply voltage. Therefore, even when the resonance frequency of the resonance element 4 changes with time due to a change in environment, the oscillation frequency of the variable-frequency oscillator 3 can be changed with an excellent followability to the resonance frequency.

As described above, considering that the resonance frequency of the resonance element 4 varies with time due to a temperature or the like, the resonance frequency detector 1 according to the first embodiment adds, to the oscillation frequency of the variable-frequency oscillator 3, the correction term generated by dividing the output of the phase detector 5 by the inclination a of the phase at the resonance frequency of the resonance element 4 and multiplying the result by −1. As a result, even when the resonance frequency of the resonance element 4 varies with time, the resonance frequency can be obtained with an excellent followability to the variation.

Second Embodiment

The resonance frequency detector 1 according to FIGS. 1 to 5 described above can be built in a sensing device that detects a physical quantity. The physical quantity is, for example, a detection target signal of various sensors of an acceleration, a gas concentration, and the like. Note that the sensing device can also be referred to as a physical quantity detection device.

Figure 6:
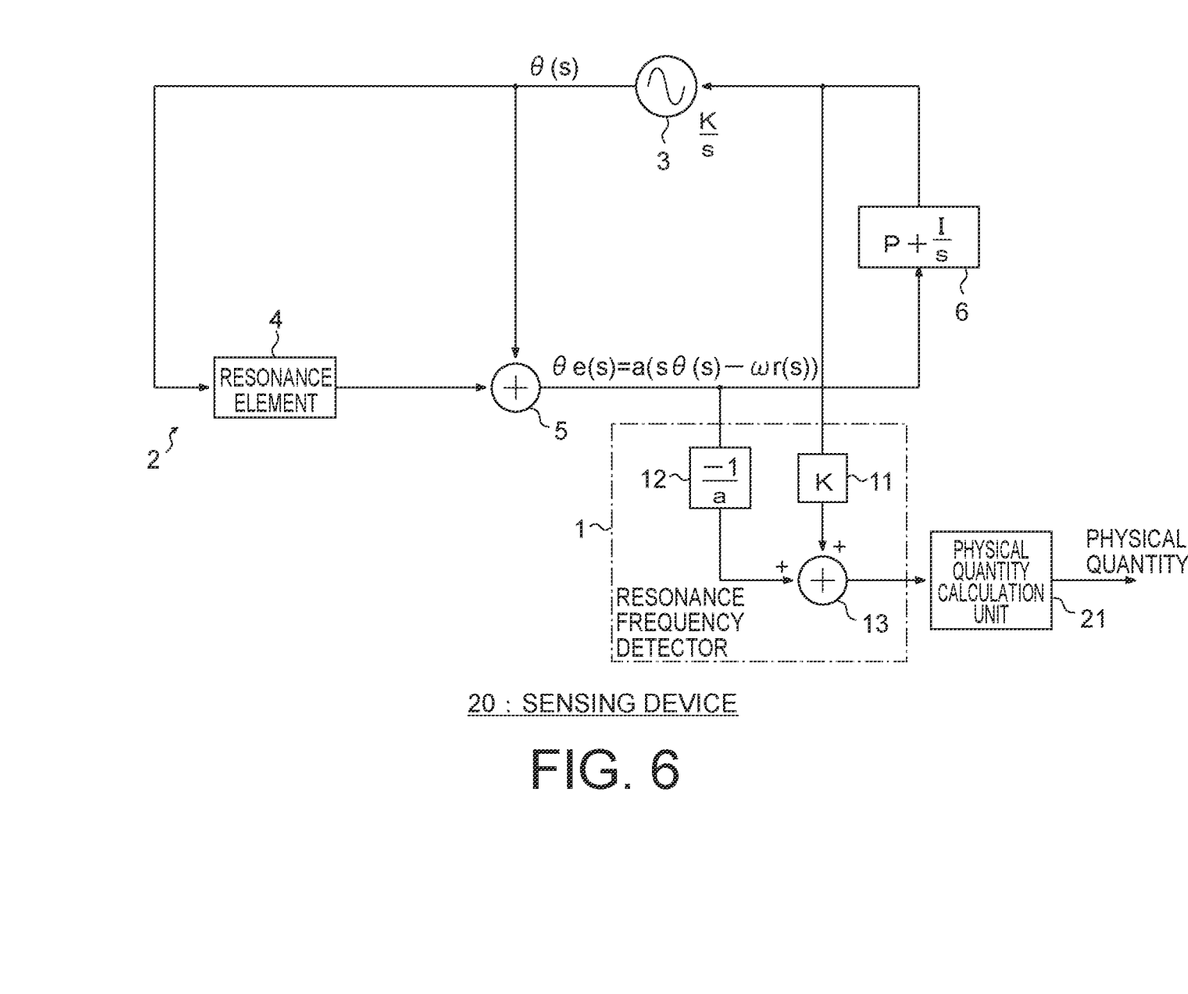
FIG. 6 is a block diagram of a sensing device including a resonance frequency detector according to a second embodiment.

FIG. 6 is a block diagram of a sensing device 20 including the resonance frequency detector 1 according to a second embodiment. The sensing device 20 in FIG. 6 includes, for example, the phase locked loop 2 and the resonance frequency detector 1 similar to those in FIG. 1, and a physical quantity calculation unit 21. Note that the sensing device 20 in FIG. 6 may incorporate the phase locked loop 2 and the resonance frequency detector 1 according to any one of FIGS. 3 to 5. That is, the sensing device 20 in FIG. 6 includes any one of the phase locked loop 2 and the resonance frequency detector 1 described in the first embodiment.

The resonance element 4 in the sensing device 20 of FIG. 6 is, for example, a a micro electro mechanical systems (MEMS) resonance element. The physical quantity calculation unit 21 detects a physical quantity on the basis of the resonance frequency of the resonance element 4.

Even when the resonance frequency of the resonance element 4 changes with time due to an acceleration, a gas concentration, or the like, the resonance frequency detector 1 in the sensing device 20 of FIG. 6 can obtain the resonance frequency that changes with time with an excellent followability by adding the correction term to the oscillation frequency of the variable-frequency oscillator 3, and thus, can detect the physical quantity more accurately.

Figure 7:
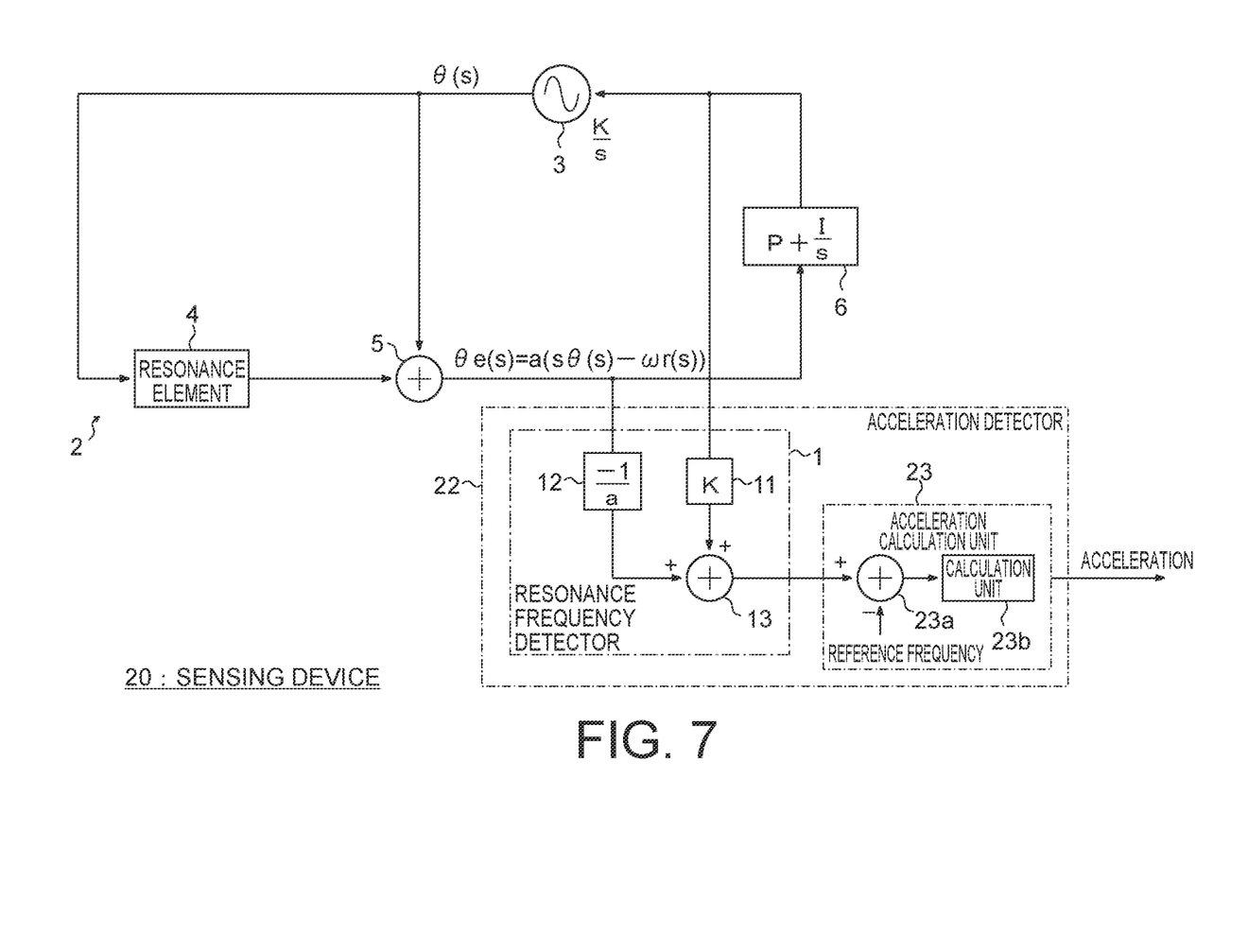
FIG. 7 is a block diagram of a sensing device including an acceleration detector.

The sensing device 20 may be, for example, an acceleration detector. That is, in a case where the resonance element 4 in the phase locked loop 2 is a MEMS resonance element, the present invention is applicable to an acceleration detector. FIG. 7 is a block diagram of the sensing device 20 including an acceleration detector 22. The sensing device 20 in FIG. 7 includes the phase locked loop 2 and the acceleration detector 22. The phase locked loop 2 of FIG. 7 is configured similarly to the phase locked loop 2 of FIG. 1, 3, 4, or 5. The acceleration detector 22 in FIG. 7 includes the resonance frequency detector 1 and an acceleration calculation unit 23.

The acceleration calculation unit 23 in FIG. 7 includes a frequency error detector 23a and a calculation unit 23b. The frequency error detector 23a calculates a frequency error between the resonance frequency detected by the resonance frequency detector 1 and a reference frequency. The reference frequency is a resonance frequency when the acceleration of the resonance element 4 is set to zero. The calculation unit 23b obtains an acceleration A by dividing the frequency error calculated by the frequency error detector 23a by an acceleration coefficient $K_A$ of the resonance element 4. The acceleration coefficient $K_A$ is a value unique to the MEMS resonance element.

In the acceleration detector 22 of FIG. 7, even when the resonance frequency of the MEMS resonance element changes with time, the resonance frequency can be accurately obtained by adding the correction term to the oscillation frequency of the variable-frequency oscillator 3, so that an acceleration can be detected more accurately.

The sensing device 20 according to the second embodiment is also applicable to, for example, a gas detector. That is, when the resonance element 4 in the phase locked loop is a MEMS resonance element having a film reactive to gas, the mass and stress of the resonance element 4 are changed in response to the gas, and the resonance frequency is changed.

Figure 8:
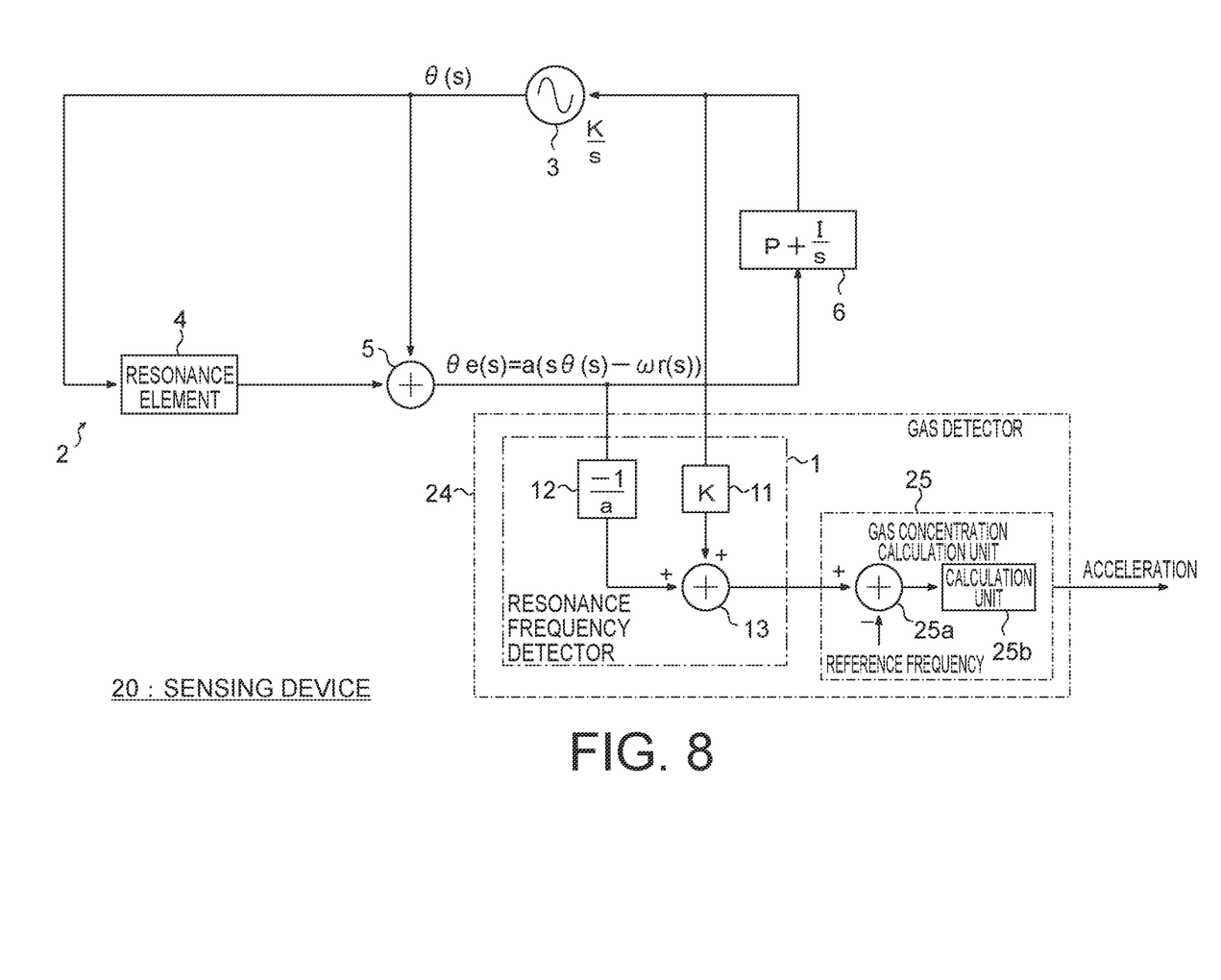
FIG. 8 is a block diagram of a sensing device including a gas detector.

FIG. 8 is a block diagram of the sensing device 20 including a gas detector 24. The sensing device 20 of FIG. 8 includes the phase locked loop 2 and the acceleration detector 22. The phase locked loop 2 of FIG. 8 is configured similarly to the phase locked loop 2 of FIG. 1, 3, 4, or 5.

The gas detector 24 in FIG. 8 includes the resonance frequency detector 1 and a gas concentration calculation unit 25. The gas concentration calculation unit 25 in FIG. 8 includes a frequency error detector 25a and a calculation unit 25b. The frequency error detector 25a calculates a frequency error between the resonance frequency detected by the resonance frequency detector 1 and a reference frequency. The reference frequency is a resonance frequency of the resonance element 4 at a predetermined gas concentration. The calculation unit 25b obtains a gas concentration G by dividing the frequency error calculated by the frequency error detector 25a by a gas concentration coefficient KG of the resonance element 4. The gas concentration coefficient KG is a value unique to the MEMS resonance element.

In the gas detector 24 of FIG. 8, even when the resonance frequency of the MEMS resonance element changes with time, the resonance frequency can be accurately obtained by adding the correction term to the oscillation frequency of the variable-frequency oscillator 3, so that a gas can be detected more accurately.

The sensing device 20 illustrated in FIGS. 6, 7 and 8 described above performs feedback control and physical quantity detection by an analog signal, but may perform the feedback control and the physical quantity detection by a digital signal.

Figure 9:
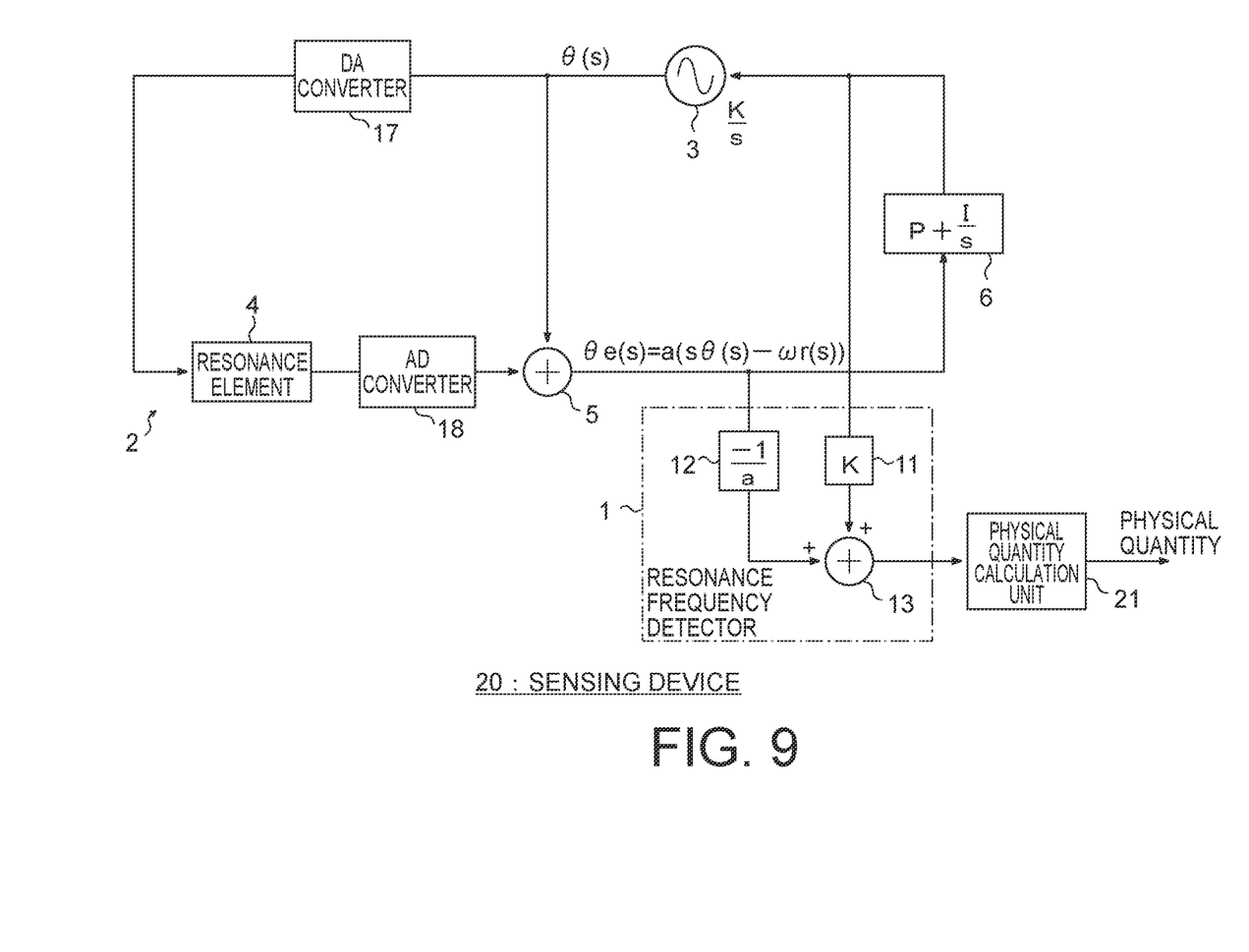
FIG. 9 is a block diagram of a sensing device according to a modification of FIG. 6.
Figure 10:
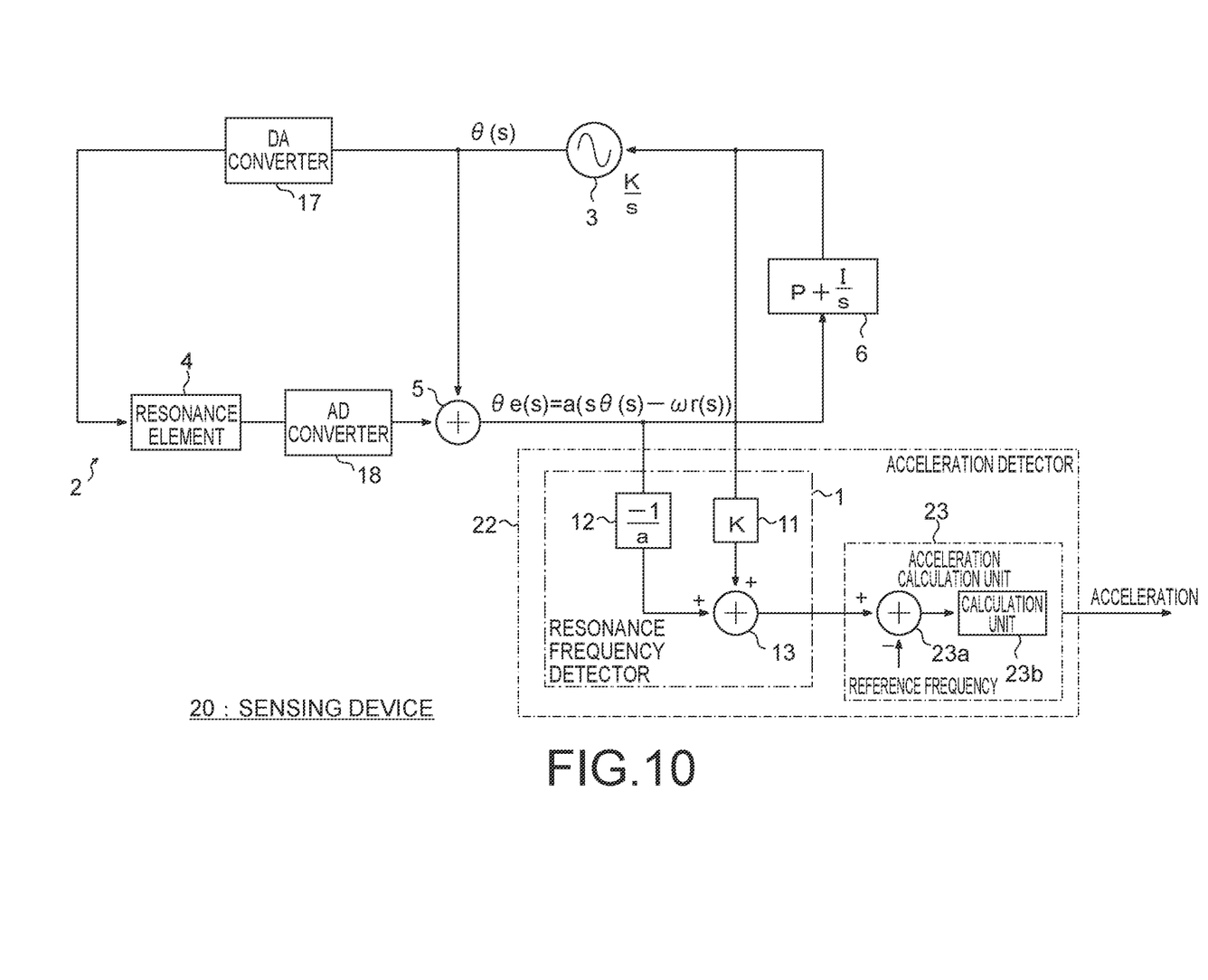
FIG. 10 is a block diagram of a sensing device according to a modification of FIG. 7.

FIG. 9 is a block diagram of the sensing device 20 according to a modification of FIG. 6, and FIG. 10 is a block diagram of the sensing device 20 according to a modification of FIG. 7.

The sensing device 20 of FIG. 9 includes a DA converter 17 and an AD converter 18 in addition to the configuration of FIG. 6. In addition, each of the variable-frequency oscillator 3, the phase detector 5, the feedback control unit 6, the oscillation frequency detector 11, the correction term generation unit 12, the adder 13, and the physical quantity calculation unit 21 in FIG. 1 is a digital circuit.

The sensing device 20 of FIG. 10 includes the DA converter 17 and the AD converter 18 in addition to the configuration of FIG. 7. In addition, each of the variable-frequency oscillator 3, the phase detector 5, the feedback control unit 6, the oscillation frequency detector 11, the correction term generation unit 12, the adder 13, and the acceleration calculation unit 23 in FIG. 1 is a digital circuit.

These digital circuits can perform processing operations without depending on the environment such as a temperature.

The DA converter 17 in FIGS. 9 and 10 converts the digital oscillation signal output from the variable-frequency oscillator 3 into an analog oscillation signal. Similarly to the resonance element 4 in FIG. 6, the resonance element 4 is an analog circuit, and performs a resonance operation when the oscillation frequency of the oscillation signal is a resonance frequency. The resonance element 4 is, for example, a MEMS resonance element.

The AD converter 18 in FIGS. 9 and 10 converts the output signal of the resonance element 4 into a digital signal. The output signal of the AD converter 18 is supplied to the phase detector 5.

As described above, by configuring the components other than the resonance element 4 in the sensing device 20 by digital circuits, it is possible to suppress the variation of the frequency conversion coefficient K of the variable-frequency oscillator 3 due to a temperature, a power supply voltage, and the like. Therefore, even when the resonance frequency of the resonance element 4 changes with time due to a change in environment such as temperature or a power supply voltage, the resonance frequency can be accurately detected with accurately following the resonance frequency. Since the detection accuracy of the resonance frequency is improved, the physical quantity, which is proportional to the resonance frequency, such as the acceleration and the gas concentration can be accurately detected.

Since the physical quantity calculation unit 21 or the acceleration calculation unit 23 can be configured by a digital circuit, the physical quantity can be more accurately detected without being affected by the environment such as a temperature and a power supply voltage as compared with a case where the physical quantity calculation unit or the acceleration calculation unit is configured by an analog circuit.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A resonance frequency detector comprising:
an adder that adds a correction term to an oscillation frequency of an output signal of an oscillator, and detects a predetermined resonance frequency of a resonance element,
wherein the correction term is generated based on a phase error in a phase locked loop and a degree of change in phase at the predetermined resonance frequency, and
the phase locked loop generates a control signal based on the phase error between an output signal of the resonance element that resonates at the predetermined resonance frequency and the output signal of the oscillator that varies the oscillation frequency according to the control signal.

2. The resonance frequency detector according to claim 1, wherein
an inclination of the phase is calculated by a Q value at the predetermined resonance frequency of the resonance element and the predetermined resonance frequency.

3. The resonance frequency detector according to claim 1, wherein an inclination of the phase is detected on the basis of an actual measurement value of a degree of change in the phase at the predetermined resonance frequency of the resonance element.

4. The resonance frequency detector according to claim 1, wherein
the oscillation frequency of the output signal of the oscillator is detected on the basis of the control signal.

5. The resonance frequency detector according to claim 4, further comprising:
an oscillation frequency detector that detects the oscillation frequency of the output signal of the oscillator by multiplying the control signal by a predetermined frequency conversion coefficient.

6. The resonance frequency detector according to claim 1, further comprising:
a correction term generator that generates the correction term by multiplying a reciprocal of an inclination of the phase at the predetermined resonance frequency of the resonance element by the phase error.

7. The resonance frequency detector according to claim 6, wherein
the correction term generator generates the correction term by multiplying the reciprocal of the inclination of the phase at the predetermined resonance frequency of the resonance element by the phase error and a predetermined negative value.

8. The resonance frequency detector according to claim 1, wherein
the adder detects a digital signal representing the predetermined resonance frequency by adding a digital signal representing the correction term based on a digital signal representing the phase error and a digital signal representing an inclination of the phase at the predetermined resonance frequency of the resonance element to the oscillation frequency of a digital signal representing the output signal of the oscillator.

9. The resonance frequency detector according to claim 1, wherein
the resonance element is a micro electro mechanical systems (MEMS) resonance element.

10. A sensing device comprising:
a resonance frequency detector; and
a phase locked loop connected to the resonance frequency detector, wherein
the resonance frequency detector includes an adder that adds a correction term to an oscillation frequency of an output signal of an oscillator, and detects a predetermined resonance frequency of a resonance element,
wherein the correction term is generated based on a phase error in the phase locked loop and a degree of change in phase at the predetermined resonance frequency, and
the phase locked loop generates a control signal based on the phase error between an output signal of the resonance element that resonates at the predetermined resonance frequency and the output signal of the oscillator that varies the oscillation frequency according to the control signal, and
the phase locked loop comprises
the oscillator,
the resonance element that resonates at the predetermined resonance frequency and outputs a signal obtained by shifting a phase of output signal of the oscillator by 90 degrees at the predetermined resonance frequency, a phase detector that detects the phase error between the output signal of the resonance element and the output signal of the oscillator, and
a feedback controller that controls the oscillation frequency of the output signal of the oscillator by proportional control and integral control according to the phase error.

11. The sensing device according to claim 10, wherein the phase detector comprises
a multiplier that multiplies the output signal of the oscillator and the output signal of the resonance element, and
a filter that detects, as the phase error, a low-frequency component signal included in a multiplication result of the multiplier.

12. The sensing device according to claim 10, wherein
the oscillator outputs a first oscillation signal, a second oscillation signal obtained by shifting a phase of the first oscillation signal by 90 degrees, and a third oscillation signal obtained by shifting a phase of the second oscillation signal by 90 degrees,
the resonance element outputs a signal obtained by shifting the phase of the first oscillation signal by 90 degrees, and
the phase detector comprises
a multiplier that multiplies the second oscillation signal by the output signal of the resonance element and multiplies the third oscillation signal by the output signal of the resonance element,
a filter that extracts a first signal of a low-frequency component included in a signal obtained by multiplying the second oscillation signal by the output signal of the resonance element and a second signal of a low-frequency component included in a signal obtained by multiplying the third oscillation signal by the output signal of the resonance element, and
a phase difference calculator that calculates the phase error on the basis of the first signal and the second signal.

13. The sensing device according to claim 10, further comprising:
a physical quantity calculator that calculates a physical quantity on the basis of the predetermined resonance frequency detected by the adder.

14. The sensing device according to claim 10, further comprising:
a frequency error detector that detects a frequency error between the predetermined resonance frequency detected by the adder and a reference frequency when an acceleration is zero; and
a physical quantity calculator that calculates the acceleration on the basis of the frequency error detected by the frequency error detector.

15. The sensing device according to claim 10, further comprising:
a frequency error detector that detects a frequency error between the predetermined resonance frequency detected by the adder and a reference frequency when a gas concentration is equal to or less than a predetermined concentration; and
a physical quantity calculator that calculates the gas concentration on the basis of the frequency error detected by the frequency error detector.

16. The sensing device according to claim 10, wherein
the oscillator, the phase detector, the feedback controller, and the adder are digital circuits,
the resonance element is an analog circuit, and the output signal of the oscillator, an output signal of the feedback controller, an output signal of the phase detector, and an output signal of the adder are digital signals.

17. The sensing device according to claim 16, further comprising:
- a digital-to-analog (DA) converter that converts a first digital signal output from the oscillator into an analog oscillation signal to be input to the resonance element; and
- an analog-to-digital (AD) converter that converts the output signal of the resonance element into a second digital signal, wherein
- the phase detector generates a third digital signal representing the phase error on the basis of the first digital signal and the second digital signal,
- the feedback controller performs proportional control and integral control according to the third digital signal to generate a fourth digital signal corresponding to the control signal,
- the oscillator varies a frequency of the first digital signal according to the fourth digital signal, and
- the adder detects an eighth digital signal representing the predetermined resonance frequency by adding a sixth digital signal representing the correction term based on the third digital signal and a fifth digital signal representing an inclination of the phase at the predetermined resonance frequency of the resonance element to a seventh digital signal obtained by multiplying the fourth digital signal by a predetermined coefficient.

* * * * *